(12) United States Patent
Goldfarb

(10) Patent No.: US 9,950,349 B2
(45) Date of Patent: Apr. 24, 2018

(54) DRYING AN EXTREME ULTRAVIOLET (EUV) PELLICLE

(71) Applicant: INTERNATIONAL BUSINESS MACHINES CORPORATION, Armonk, NY (US)

(72) Inventor: Dario L. Goldfarb, Dobbs Ferry, NY (US)

(73) Assignee: Internationa Business Machines Corporation, Armonk, NY (US)

( * ) Notice: Subject to any disclaimer, the term of this patent is extended or adjusted under 35 U.S.C. 154(b) by 183 days.

(21) Appl. No.: 14/855,076

(22) Filed: Sep. 15, 2015

(65) Prior Publication Data

US 2017/0075212 A1    Mar. 16, 2017

(51) Int. Cl.
B08B 3/08      (2006.01)
B08B 3/04      (2006.01)
G03F 1/62      (2012.01)

(52) U.S. Cl.
CPC ............. B08B 3/08 (2013.01); B08B 3/04 (2013.01); G03F 1/62 (2013.01)

(58) Field of Classification Search
CPC .. B08B 3/00; B08B 3/04; B08B 3/045; B08B 3/08; B08B 7/00; B08B 7/04; G03F 1/60; G03F 1/62
See application file for complete search history.

(56) References Cited

U.S. PATENT DOCUMENTS

| | | | |
|---|---|---|---|
| 6,180,292 B1 | 1/2001 | Acosta et al. |
| 6,544,693 B2 | 4/2003 | Levinson et al. |
| 6,811,936 B2 | 11/2004 | Smith et al. |
| 7,169,253 B2 | 1/2007 | Chen et al. |
| 7,537,114 B2 | 5/2009 | Gallagher et al. |
| 7,951,513 B2 | 5/2011 | Kubota et al. |
| 8,002,899 B2 | 8/2011 | Wu et al. |
| 8,518,612 B2 | 8/2013 | Akiyama et al. |
| 2005/0186488 A1* | 8/2005 | Su ........................ G03F 1/40 430/5 |
| 2009/0258159 A1 | 10/2009 | Su et al. |
| 2009/0286170 A1* | 11/2009 | Shirasaki ............. G03F 1/62 430/5 |
| 2014/0370423 A1 | 12/2014 | Goldfarb |

* cited by examiner

*Primary Examiner* — Saeed T Chaudhry
(74) *Attorney, Agent, or Firm* — Tutunjian & Bitetto, P.C.; Vazken Alexanian

(57) ABSTRACT

Systems and methods for rinsing one or more pellicles during fabrication, including immersing and soaking the one or more pellicles in a rinse bath solution for a particular time period, forming a top layer above the rinse bath solution, the top layer having a lower surface tension than the rinse bath, and withdrawing the one or more pellicles through the top layer for drying.

10 Claims, 4 Drawing Sheets

DRYING AN EXTREME ULTRAVIOLET (EUV) PELLICLE

BACKGROUND

Technical Field

The present invention relates to Extreme Ultraviolet (EUV) pellicle fabrication, and more particularly to drying EUV pellicles during EUV pellicle fabrication.

Description of the Related Art

During semiconductor wafer fabrication, extreme ultraviolet (EUV) light may be employed in, for example, a lithographic process to enable transfer of very small patterns (e.g., nanometer-scale patterns) from a mask to a semiconductor wafer. In EUV lithography, a pattern formed on an EUV lithographic mask (e.g., EUV reticle) may be transferred to a semiconductor wafer by reflecting EUV light off of portions of a reflective surface. A pellicle can be placed in front of the mask to, for example, avoid contamination of the mask and to prevent unwanted particles from reaching the mask surface, which may enable avoidance of alteration of the pattern to be transferred by the mask.

In the case of EUV mask technology, pellicles are conventionally very thin (e.g., ~100 nm or less), therefore managing the mechanical stability of the ultra-thin pellicle membrane in the presence of outside forces (e.g., capillary force, vibrations, etc.) during fabrication is challenging, especially given the large surface area with respect to the thickness of an EUV pellicle. Among the plurality of forces which may be exerted on an EUV pellicle surface, a comparatively difficult force to overcome is the presence of a capillary force during the withdrawal of the membrane from a rinse bath (e.g., de-ionized water (DI $H_2O$)) for drying of the pellicle. Such capillary force is operative at the liquid-gas-solid boundary on both sides of the partially immersed membrane, and may result in a downward pulling force, which may be described by the Wilhelmy equation (e.g., $F=2\cdot\gamma\cdot l \cos\theta$). Such force (F) may break even small EUV pellicles while the pellicle is being withdrawn from the rinse bath.

Conventional systems and methods that minimize the surface tension ($\gamma$) of the drying liquid may force a fluid flow (e.g., Marangoni drying, critical point drying, etc.), and may involve volumetric changes (e.g., freeze drying), or specialty non-volatile chemicals (e.g., rinses including surfactants, Langmuir Blodgett films, etc.). However, no conventional systems or methods can effectively and/or consistently fabricate ultra-thin, large-area EUV pellicles.

SUMMARY

A method for rinsing one or more pellicles during fabrication includes immersing and soaking the one or more pellicles in a rinse bath solution for a particular time period. A top layer is formed above the rinse bath solution, the top layer having a lower surface tension than the rinse bath, and the one or more pellicles are withdrawn through the top layer for drying.

A system for rinsing one or more pellicles during fabrication includes a container, and a rinse bath solution, disposed in the container, for immersing and soaking the one or more pellicles for a particular time period. A top layer is formed above the rinse bath solution after immersing the one or more pellicles in the rinse bath solution. The top layer has a lower surface tension than the rinse bath, and a withdrawal mechanism withdraws the one or more pellicles from the container after immersion.

A method for rinsing one or more pellicles during fabrication includes immersing and soaking the one or more pellicles in a rinse bath solution for a particular time period. A top layer is formed above the rinse bath solution, the top layer being less dense, and having a lower surface tension than the rinse bath, and the one or more pellicles are withdrawn through the top layer for drying.

These and other features and advantages will become apparent from the following detailed description of illustrative embodiments thereof, which is to be read in connection with the accompanying drawings.

BRIEF DESCRIPTION OF THE SEVERAL VIEWS OF THE DRAWINGS

The disclosure will provide details in the following description of preferred embodiments with reference to the following figures wherein.

DETAILED DESCRIPTION

Figure 1:
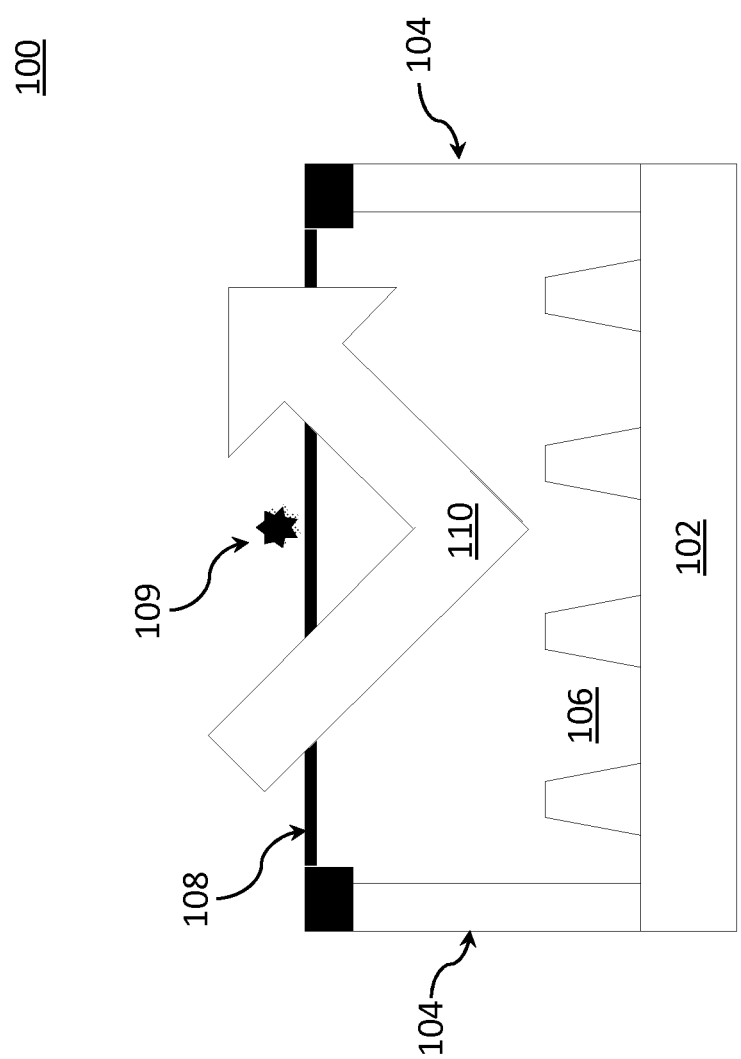
FIG. 1 shows an exemplary system employing a pellicle (e.g., extreme ultraviolet (EUV) pellicle) for lithography, in accordance with one illustrative embodiment of the present principles.

The present principles are directed to systems and methods for drying one or more Extreme Ultraviolet (EUV) pellicles during EUV fabrication.

Advanced patterning techniques (e.g., KrF (248 nm), ArF (193 nm, etc.)) for lithography may employ projection-reduction imaging systems that make use of a photomask (e.g., including the physical image to transfer the desired layout to a semiconductor substrate (e.g., wafer)). To enable a faithful image transfer, physical images/patterns present on the photomask should be free of defects or particulates to avoid the image printing of such foreign material (FM) onto the photoresist layer during lithographic exposure.

As such, the semiconductor industry has adopted the use of protective pellicles for a plurality of lithographic wavelengths, and a protective pellicle may be fabricated according to various embodiments of the present principles (described in further detail herein below). A pellicle may include a thin (e.g., ~1 micron) polymeric film (e.g., nitrocellulose, Polytetrafluoroethylene (PTFE) (e.g., forms of Teflon™, etc.), and may be mounted on a supporting frame which is glued to the photomask, resting at a short distance (e.g., ~6 mm) away from the mask surface. At this distance, any foreign material (FM) that lands on the pellicle surface will be located far enough away from the focal plane during the image transfer process so that it will not create a foreign pattern on the photoresist layer. The area of a commercial pellicle is conventionally commensurate to the size of a production photomask (e.g., 6×6 inches), and needs to be highly transparent to the imaging wavelength, relatively tensile to avoid wrinkling or sagging, and resistant to radiation damage. The pellicle has become an integral component in the manufacturing process for most Integrated Circuit (IC) manufacturers and high-resolution projection photolithography systems used in, for example, the manufacturing of thin film magnetic reading heads, liquid crystal display (LCD) flat panels, micro electromechanical system (e.g., MEMS), etc.

In one embodiment, pellicles, as fabricated using the present principles, may also be employed during EUV lithography (e.g., wavelength equal to 13.5 nm), which is a prospective lithographic technique (e.g., for 7 nm semiconductor technology node and beyond). However, a pellicle material that is suitable for EUV applications may use of extremely thin layers due to the strong absorption of EUV radiation by dense matter. For example, an EUV pellicle based on silicon or silicon nitride may achieve 90% transparency for the single pass of an EUV ray of light by employing a thicknesses of 50 nm or 15 nm, respectively.

Several EUV pellicle materials have been employed or proposed, including, for example, polycrystalline silicon, monocrystalline silicon, graphitic carbon, carbon nanotubes, etc.

In one embodiment, fabrication of a pellicle suitable for EUV imaging may be performed by selectively etching a wafer (e.g., silicon) including a pellicle material layer to create a desired free standing membrane (e.g., pellicle). This subtractive method may employ wet processing methods and chemicals, so that the ultra-thin unsupported film (e.g., pellicle) is able to withstand forces exerted on its surface during etching and rinsing without breaking. Examples of forces that may be exerted on a pellicle during etching and/or rinsing include mechanical vibrations induced during manual pellicle handling or by moving parts that assist with controlled motorized translation, liquid or air pressure differentials on either side of the membrane (e.g., pellicle) because of forced or natural convection and capillary forces from meniscus formation at the liquid-air interface, etc.

Conventional systems and methods which minimize the capillary force of the drying liquid are, for example, the Marangoni drying (which incorporates the use of a flow of organic vapor) for drying a photomask, and the use of a flow of organic liquid for drying of a photomask. However the application of either one of such methods to the drying of an EUV pellicle is unsuitable due to the forced fluid flow, which may damage the EUV pellicle. Managing the mechanical stability of the ultra-thin membrane (e.g., pellicle) in the presence of such forces is particularly challenging given the comparatively large area of the EUV pellicle to its thickness.

In one embodiment, the present principles may form a layer (e.g., supernatant polar organic layer) on top of a rinse bath (e.g., de-ionized water (DI $H_2O$) rinse bath), and the layer may be stagnant during withdrawal of the EUV pellicle from the rinse bath. The present principles enable removal from of the wetted membrane (e.g., wetted EUV pellicle) from the rinse bath in the presence of a low-surface-tension fluid (e.g., lower surface tension/capillary force than the rinse bath) that is miscible with water without causing any deleterious effects on the EUV pellicle that result from such withdrawal using conventional systems and methods.

In a particularly useful embodiment, the supernatant polar organic layer may be formed by introducing a floating alcohol layer on top of a rinse bath (e.g., DI $H_2O$ rinse bath) after a membrane (e.g., EUV pellicle) has been removed from, for example, a wet etch tank and immersed fully into the rinse bath. The membrane (e.g., EUV pellicle) may be soaked in the rinse bath bottom layer to dilute and/or eliminate any residual chemicals (e.g., etching chemicals) from the membrane. The membrane may then be withdrawn from the rinse bath bottom layer by traversing through the top floating alcohol layer before being dried in, for example, an atmospheric environment of a manufacturing facility, and the floating alcohol layer may leave no residue on the pellicle after withdrawal from the rinse bath.

In various embodiments, suitable alcohols for use as the floating alcohol layer may include, for example, alcohols with lower density than water, relatively low surface tension (e.g., lower than water), good water solubility, and/or high viscosity. Some examples of suitable alcohols include isopropanol (e.g., density=0.786 g/cm$^3$, surface tension ($\gamma$)=21.32 mN/m at 20° C.; water solubility=fully miscible; viscosity=1.96 cP at 25° C.), and n-propanol (e.g., density=0.803 g/cm$^3$; $\gamma$=23.8 mN/m at 20° C.; water solubility=fully miscible; viscosity=1.96 cP at 25° C.).

It is to be understood that the present invention will be described in terms of a given illustrative architecture; however, other architectures, structures, substrate materials and process features and steps may be varied within the scope of the present invention.

It will also be understood that when an element such as a layer, region or substrate is referred to as being "on" or "over" another element, it can be directly on the other element or intervening elements may also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

The present embodiments may include a design for an integrated circuit chip and/or EUV pellicle, which may be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer may transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein may be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements (e.g., SiN). These compounds include different proportions of the elements within the compound (e.g., SiN includes $Si_xNi_{1-x}$ where x is less than or equal to 1, etc. In addition, other elements may be included in the compound, and still function in accordance with the present principles. The compounds with additional elements will be referred to herein as alloys.

Reference in the specification to "one embodiment" or "an embodiment" of the present principles, as well as other variations thereof, means that a particular feature, structure, characteristic, and so forth described in connection with the embodiment is included in at least one embodiment of the present principles. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This may be extended, as readily apparent by one of ordinary skill in this and related arts, for as many items listed.

Referring now to the drawings in which like numerals represent the same or similar elements and initially to FIG. 1, an exemplary system 100 employing a pellicle 108 (e.g., extreme ultraviolet (EUV) pellicle) is illustratively depicted in accordance with an embodiment of the present principles. In an embodiment, one or more EUV pellicles 108 may be attached to a frame 104, and may act as a barrier to keep particles 109 (e.g., contamination) away from an imaging (e.g., focal) plane 106 while allowing EUV light 110 to pass through when performing imaging of, for example, an EUV mask 102. In an embodiment, an EUV pellicle 108 may include a large area-to-thickness unsupported membrane that is extremely fragile and sensitive to stress (e.g., in terms of force applied to a particular cross-sectional area of the pellicle 108.

In one embodiment, an EUV pellicle 108 may be fabricated from a plurality of materials according to various embodiments of the present principles. For example, an EUV pellicle 108 may be fabricated from ultra-thin polysilicon (e.g., 50 nm thick) or silicon nitride (e.g., 15 nm thick), although other materials may be employed according to various embodiments of the present principles.

Figure 2:
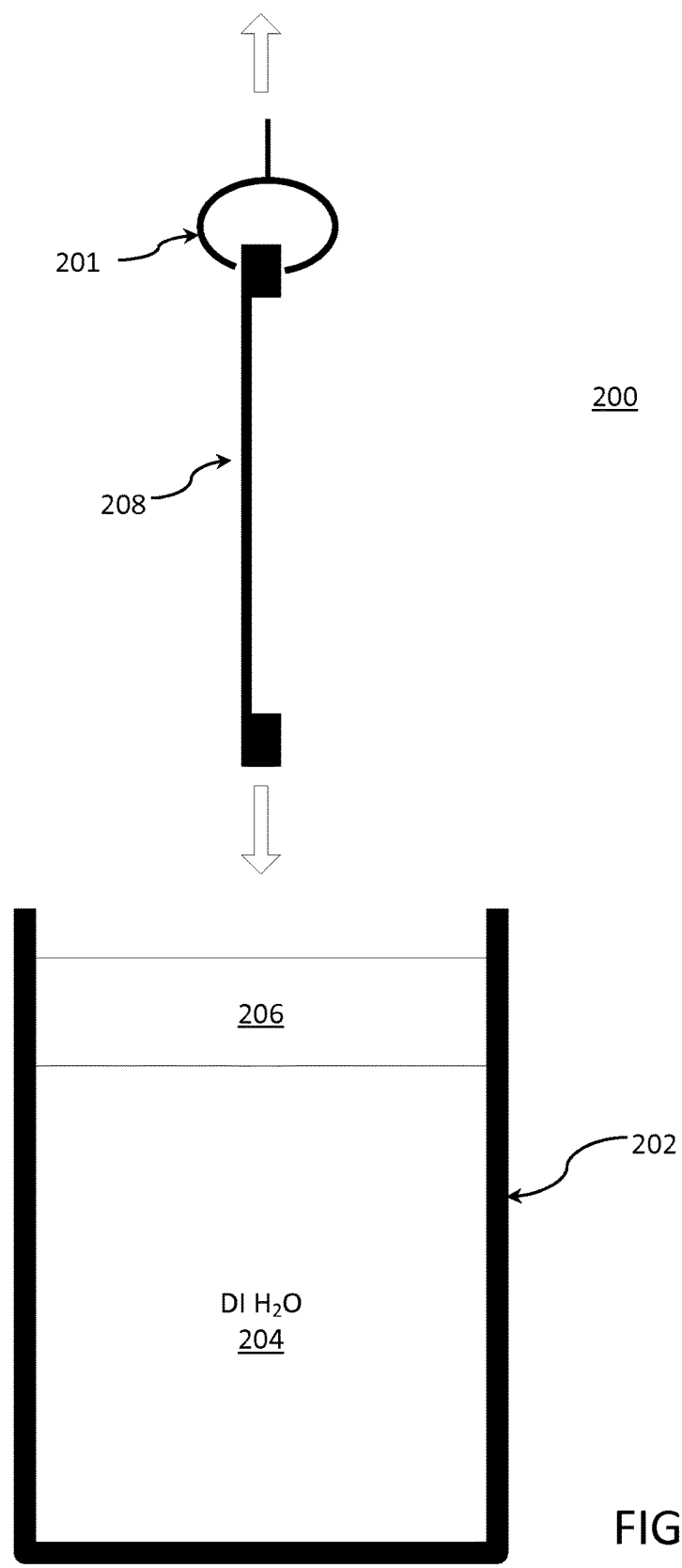
FIG. 2 shows an exemplary system for pellicle (e.g., EUV pellicle) fabrication, in accordance with one illustrative embodiment of the present principles.

Referring now to FIG. 2, an exemplary system 200 for pellicle (e.g., EUV pellicle) fabrication is illustratively depicted in accordance with an embodiment of the present principles. In one embodiment, one or more EUV pellicles 208 may be fabricated using, for example, a subtractive (e.g., wet etch) process, and the pellicles 208 may be rinsed in a rinse bath container 202 to remove any residue (e.g., chemical residue) left on the pellicle 208 from, for example, wet etching.

In an embodiment, the rinse bath container 202 may include a rinse bath solution 204 (e.g., DI $H_2O$), and a layer 206 (e.g., supernatant polar organic layer) with relatively low surface tension (e.g., as compared to DI $H_2O$) for controlling capillary forces during withdrawal of the pellicle 208 from the rinse bath solution 204 (e.g., DI $H_2O$). In an embodiment, the supernatant polar organic layer 206 may be introduced to the rinse bath container 202 after immersing the pellicle 208 in the rinse bath solution according to the present principles, and will be described in further detail herein below. In an embodiment, a pellicle withdrawal device 201 may be employed for withdrawing the pellicle from the rinse bath 204. In one embodiment, the layer 206 may include two or more layers (e.g., of different materials), and the two or more layers may include materials with different densities, capillary forces, etc. according to the present principles.

Figure 3:
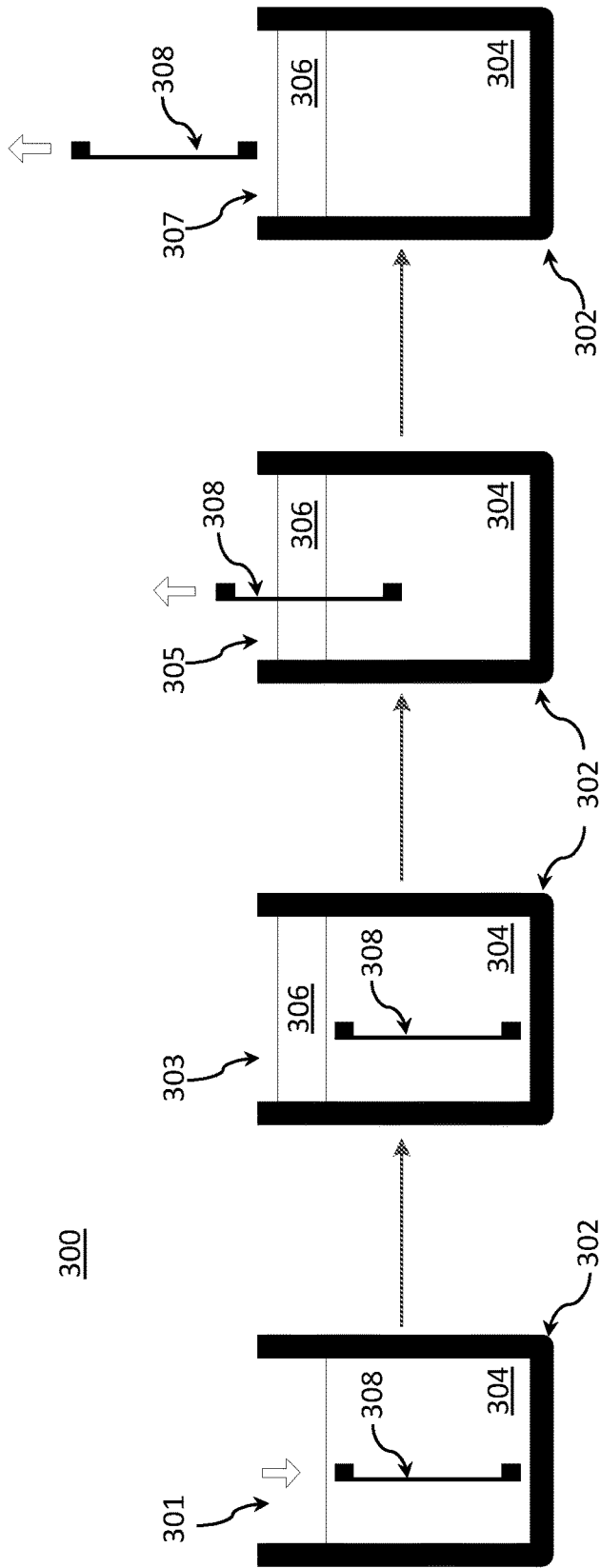
FIG. 3 shows an exemplary system/method for rinsing and/or drying a pellicle (e.g., EUV pellicle) during pellicle fabrication, in accordance with one illustrative embodiment of the present principles.

Referring now to FIG. 3, an exemplary system/method 300 for rinsing and/or drying a pellicle (e.g., EUV pellicle) during fabrication is illustratively depicted in accordance with an embodiment of the present principles. In one embodiment, a rinse bath solution 304 (e.g., DI $H_2O$) may be introduced into a container 302 (e.g., rinse bath container). A pellicle 308 (e.g., EUV pellicle) may be immersed and soaked in the rinse bath solution 304 to remove any residual etching chemicals (e.g., KOH). The EUV pellicle 308 may be soaked for a pre-determined period of time in the rinse bath 304 at phase 301, and a supernatant polar organic (e.g., alcohol) layer 306 may be formed on top of the rinse bath solution 304 at phase 303 according to the present principles. In an embodiment, the alcohol layer 306 may be formed after the pellicle 308 has been fully immersed in the rinse bath 304. In other embodiments, an alcohol layer 306 may be floated on top of the rinse bath solution 304 before immersion of the EUV pellicle 308 according to the present principles.

In an embodiment, after soaking the pellicle 308 in the rinse bath 304 to remove residual etching chemicals at phase 301, the pellicle 308 may be withdrawn from the rinse bath 304 through the alcohol layer 306 at phase 305 and dried at phase 307 in, for example, the atmospheric environment of a manufacturing facility. In an embodiment, removing the pellicle 308 through an alcohol layer 306 prevents breaking of the pellicle 308 because the top alcohol layer 306 has lower capillary forces present at the liquid-air junction than the rinse bath 304.

In an embodiment, the alcohol layer 306 may be a stagnant layer, and the surface tension of the alcohol layer 304 may be less than that of water (e.g., 20 mN/m) according to the present principles. In some embodiments, the top stagnant layer may include a surface tension between 20 mN/m and 30 mN/m. In some embodiments, alcohols for use as the supernatant polar organic layer 306 may include alcohols with density lower than water, low surface tension (in comparison to water), good water solubility, and/or high viscosity (in comparison to water) according to the present principles. Examples of alcohols for use as the alcohol layer 306 and their properties in comparison to properties of water are illustratively depicted in the following table:

TABLE 1

| FLUID | DENSITY | SURFACE TENSION | $H_2O$ SOLUBILITY | VISCOSITY |
|---|---|---|---|---|
| Water ($H_2O$) | 1.0 g/cm$^3$ | 72 mN/m | N/A | 1.0 cP |
| Isopropanol (IPA) | 0.786 g/cm$^3$ | 21.32 mN/m | Completely Miscible | 1.96 cP |
| n-propanol | 0.803 g/cm$^3$ | 23.8 mN/m | Completely Miscible | 1.96 cP |

In an embodiment, although the fluids (e.g., iso-propyl alcohol (IPA), n-propanol, etc.) employed as the alcohol layer 306 are fully miscible in water, they form phases that remain distinctly separated from water for several hours, which is enough time for rinsing and withdrawing of the pellicle according to the present principles. Although the above liquids are listed as candidates for the supernatant polar organic layer 306 (e.g., alcohol layer), any liquids with similar properties (e.g., density lower than water, surface tension lower than water, etc.) may be employed as the top layer 306 according to various embodiments of the present principles.

Figure 4:
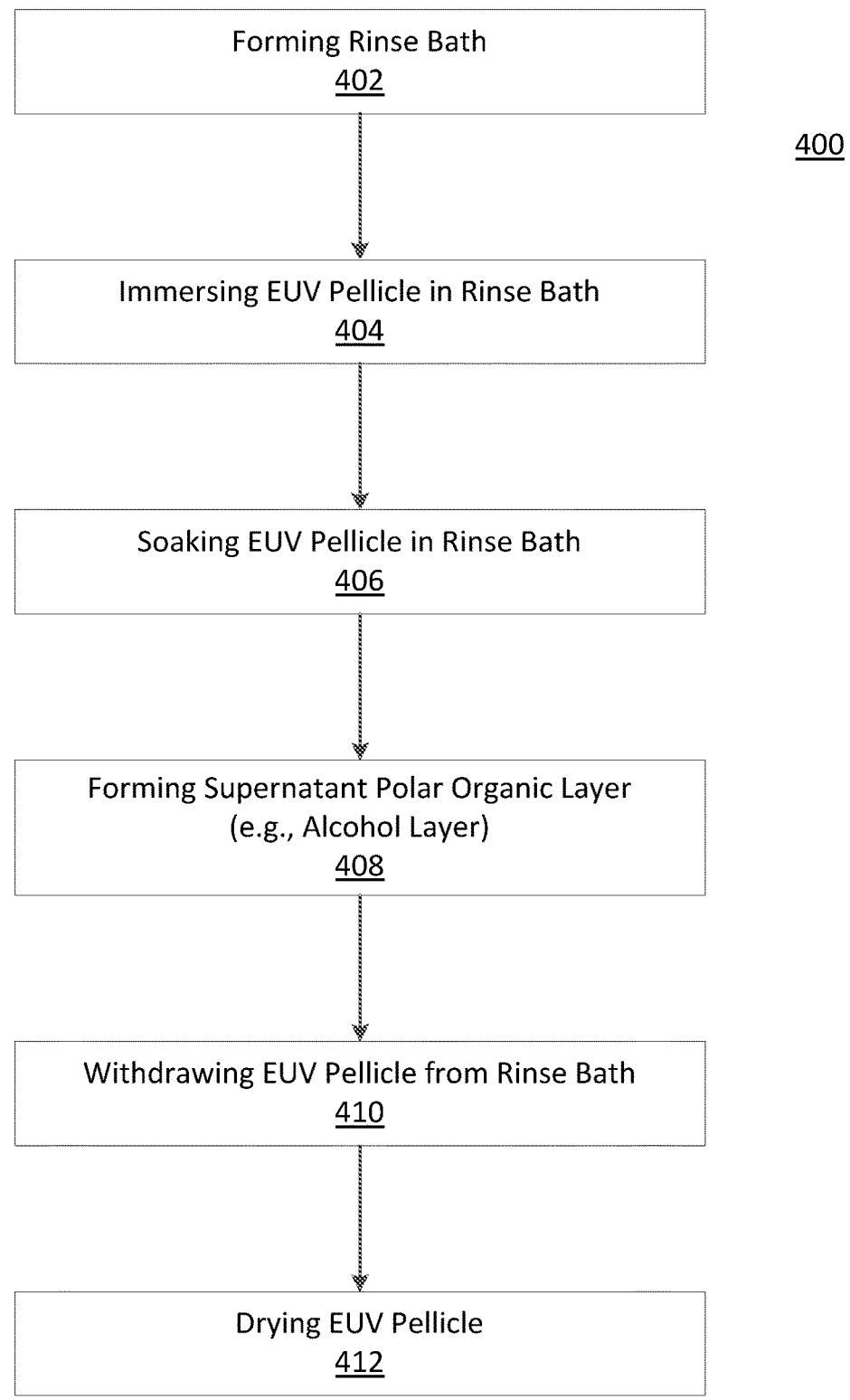
FIG. 4 is a block/flow diagram illustratively depicting a method for rinsing and/or drying a pellicle (e.g., EUV pellicle) during pellicle fabrication, in accordance with one illustrative embodiment of the present principles.

Referring now to FIG. 4, a method 400 for rinsing and/or drying a pellicle (e.g., EUV pellicle) during fabrication is illustratively depicted in accordance with an embodiment of the present principles. In one embodiment, a rinse bath may be formed in block 402, and the rinse bath may comprise, for example, de-ionized water (DI $H_2O$) according to the present principles. In block 404, a pellicle (e.g., EUV pellicle) may be immersed in the rinse bath, and the pellicle may be soaked in the rinse bath for a particular period of time (e.g., seconds, minutes, hours, etc.) to remove any residual etching chemicals (e.g., KOH) from the pellicle. The particular period of time may vary depending on a plurality of factors (e.g., concentration and type of dissolved solids in the wet etchant, viscosity and density of the residual etching layer attached to the pellicle surface, etc.).

In block 408, a supernatant polar organic layer (e.g., alcohol) may be formed on top (e.g., floated) of the rinse bath (e.g., DI $H_2O$) after the pellicle has been immersed and soaked in the rinse bath in blocks 404 and 406, respectively, according to an embodiment of the present principles. As described above with reference to FIG. 3, alcohols for use for formation of the supernatant polar organic layer may include alcohols with densities lower than water, low surface tension (in comparison to water), complete miscibility with water, and/or high viscosity (in comparison to water) according to various embodiments of the present principles.

In block 408, during formation of the supernatant polar organic layer (e.g., alcohol layer), although the fluids (e.g., IPA, n-propanol, etc.) employed as the alcohol layer may be fully miscible in water, they form phases that may remain distinctly separated from water for several hours, which is enough time for rinsing and withdrawal of the pellicle according to the present principles. Although the above liquids are listed as candidates for the supernatant polar organic layer (e.g., alcohol layer), any liquids with similar properties (e.g., density lower than water, surface tension lower than water, etc.) may be employed for formation of the alcohol layer in block 408 according to various embodiments of the present principles.

In block 410, the pellicle (e.g., EUV pellicle) may be withdrawn from the rinse bath through the layer (e.g., alcohol layer) formed in block 408, and may be dried in block 412 in, for example, an atmospheric environment of a manufacturing facility. Withdrawing the pellicle through an alcohol layer may prevent breaking of the pellicle because the top alcohol layer formed in block 408 may exert lower capillary forces at the liquid-air junction than the rinse bath solution alone. In an embodiment, the alcohol layer formed in block 408 may be a stagnant layer, and the surface tension of the alcohol layer may be less than that of water (e.g., 20 mN/m) according to the present principles. In some embodiments, alcohol is used for the layer in block 408 as alcohol may evaporate from the pellicle without leaving any residue.

Having described preferred embodiments of a system and method (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A method for rinsing one or more pellicles during fabrication, comprising:
    immersing and soaking the one or more pellicles in a rinse bath solution for a particular time period;
    forming a top layer above the rinse bath solution, the top layer having a lower surface tension than the rinse bath and comprising a supernatant polar organic layer; and
    withdrawing the one or more pellicles through the top layer for drying.

2. The method of claim 1, wherein the one or more pellicles includes one or more extreme ultraviolet (EUV) pellicles.

3. The method of claim 1, wherein the rinse bath solution comprises deionized water (DI $H_2O$).

4. The method of claim 1, wherein the top layer comprises a stagnant alcohol layer with a surface tension between 20 mN/m and 30 mN/m.

5. The method of claim 1, wherein the top layer is formed from completely miscible materials, wherein the completely miscible materials of the top layer remain distinctly separated from the rinse bath solution for two or more hours.

6. The method of claim 1, wherein the one or more pellicles are formed by a subtractive process, the subtractive process including wet etching.

7. The method of claim 1, wherein the one or more pellicles are formed from one of polycrystalline silicon, monocrystalline silicon, or silicon nitride.

8. The method of claim 1, wherein the one or more pellicles are formed from one of graphitic carbon or carbon nanotubes.

9. A method for rinsing one or more pellicles during fabrication, comprising:
    immersing and soaking the one or more pellicles in a rinse bath solution for a particular time period;
    forming a top layer above the rinse bath solution, the top layer being less dense, having a lower surface tension than the rinse bath, and comprising a supernatant polar organic layer; and
    withdrawing the one or more pellicles through the top layer for drying.

10. The method of claim 9, wherein the top layer is formed from completely miscible materials, wherein the completely miscible materials of the top layer remain distinctly separated from the rinse bath solution for two or more hours.

* * * * *